(12) United States Patent
Thaler et al.

(10) Patent No.: US 11,215,536 B2
(45) Date of Patent: Jan. 4, 2022

(54) METHOD AND APPARATUS FOR CAPTURING VOLUME INFORMATION OF THREE-DIMENSIONAL SAMPLES

(71) Applicant: Carl Zeiss Microscopy GmbH, Jena (DE)

(72) Inventors: Marlene Thaler, Aalen (DE); Robert Kirmse, Gablitz (AT); Josef Biberger, Wildenberg (DE); Judith Kimling, Aalen (DE); Lars Ehrhardt, Oberkochen (DE)

(73) Assignee: Carl Zeiss Microscopy GmbH, Jena (DE)

( * ) Notice: Subject to any disclaimer, the term of this patent is extended or adjusted under 35 U.S.C. 154(b) by 0 days.

(21) Appl. No.: 16/922,182

(22) Filed: Jul. 7, 2020

(65) Prior Publication Data

US 2021/0018403 A1 Jan. 21, 2021

(30) Foreign Application Priority Data

Jul. 16, 2019 (DE) .......................... 102019210452.5

(51) Int. Cl.
*G01N 1/06* (2006.01)
*H01J 37/28* (2006.01)
(Continued)

(52) U.S. Cl.
CPC ................ *G01N 1/06* (2013.01); *H01J 37/20* (2013.01); *H01J 37/244* (2013.01); *H01J 37/28* (2013.01);
(Continued)

(58) Field of Classification Search
CPC .. G01N 1/06; G01N 1/286; G01N 2001/2873; G01N 1/32; H01J 37/28;
(Continued)

(56) References Cited

U.S. PATENT DOCUMENTS

| | | | |
|---|---|---|---|
| 8,878,147 B2* | 11/2014 | Robinson | B23K 15/0006 250/492.1 |
| 2003/0128997 A1* | 7/2003 | Sakaizawa | G03G 15/0812 399/55 |

(Continued)

FOREIGN PATENT DOCUMENTS

DE   10 2012 217 761 A1   4/2014

OTHER PUBLICATIONS

B. Titze et al., Volume scanning electron microscopy for imaging biological ultrastructure, Biology of the Cell 108 (2016), p. 307-323.

(Continued)

*Primary Examiner* — David A Vanore
(74) *Attorney, Agent, or Firm* — Fish & Richardson P.C.

(57) ABSTRACT

Methods and apparatuses for capturing volume information of microscopic samples include a microscope system having at least one particle beam column, by which a beam of focused, charged particles can be generated, and an in-situ microtome, i.e., a microtome integrated in the microscope system. The method cam include a) providing a sample including a volume of interest (VOI); b) setting a cut surface lying within the sample; c) defining the set cut surface as processing surface; d) exposing the cut surface by virtue of ablating sample material by cutting with the in-situ microtome; and e) processing the sample with the particle beam, wherein the start point of the processing is disposed on the exposed processing surface.

20 Claims, 7 Drawing Sheets

(51) Int. Cl.
  *H01J 37/20* (2006.01)
  *H01J 37/244* (2006.01)
(52) U.S. Cl.
  CPC ............ *H01J 2237/2007* (2013.01); *H01J 2237/20214* (2013.01); *H01J 2237/226* (2013.01); *H01J 2237/31749* (2013.01)
(58) Field of Classification Search
  CPC .... H01J 37/20; H01J 37/244; H01J 2237/226; H01J 2237/31749; H01J 2237/20214; H01J 2237/2007; H01J 37/3023; H01J 37/3005; H01J 2237/206; H01J 2237/31745
  See application file for complete search history.

(56) References Cited

U.S. PATENT DOCUMENTS

| | | | | |
|---|---|---|---|---|
| 2006/0234396 | A1* | 10/2006 | Tomita | C25D 11/16 438/3 |
| 2012/0223228 | A1 | 9/2012 | Galloway | |
| 2013/0140459 | A1* | 6/2013 | Galloway | H01J 37/28 250/310 |
| 2016/0322194 | A1* | 11/2016 | Kooijman | H01J 37/28 |
| 2016/0365224 | A1* | 12/2016 | Potocek | H01J 37/3005 |
| 2017/0031033 | A1* | 2/2017 | Makarov | H01J 49/0004 |
| 2018/0218878 | A1* | 8/2018 | Xu | H01J 37/023 |
| 2019/0019650 | A1* | 1/2019 | Schmaunz | H01J 37/20 |

OTHER PUBLICATIONS

A. Zankel et al., Ultramicrotomy in the ESEM, a versatile method for materials and life sciences, Journal of microscopy 233 (2009), p. 140-148.
Denk, W. & Horstmann, H. (2004): Serial Block-Face Scanning Electron Microscopy to Reconstruct Three-Dimensional Tissue Nanostructure, PloS Biology, vol. 2, issue 11, pp. 1900-1908.
Handschuh et al. (2013): A correlative approach for combining microCT, light and transmission electron microscopy in a single 3D scenario, Frontiers in Zoology, 10, 44; and.
Ng et al. (2016): Genetically targeted 3D visualization of *Drosophila* neurons under Electron Microscopy and X-Ray Microscopy using miniSOG, Scientific Reports 6: 38863.
German Office Action, with translation thereof, for corresponding Appl No. 10 2019 210 452.5, dated Dec. 21, 2019.

* cited by examiner

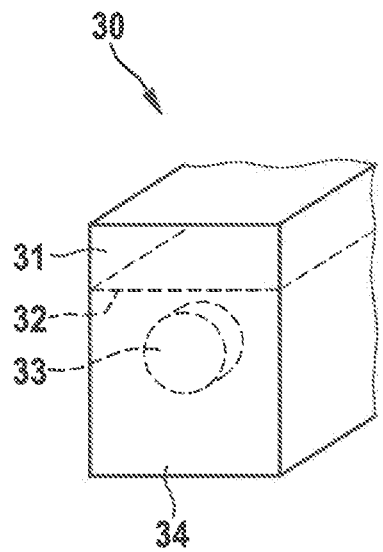
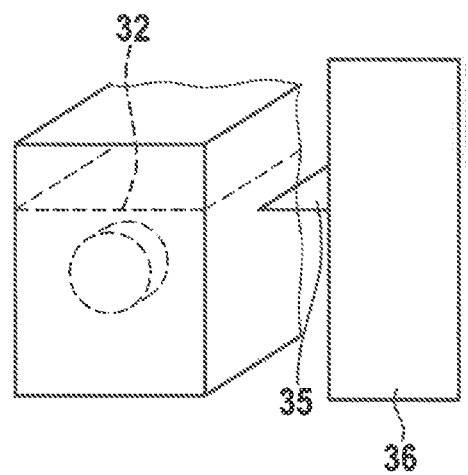
FIG. 3A                FIG. 3B
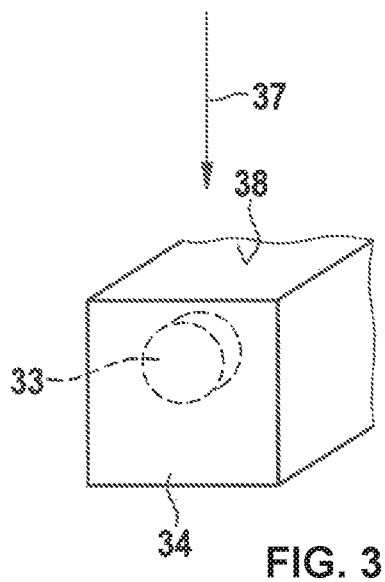
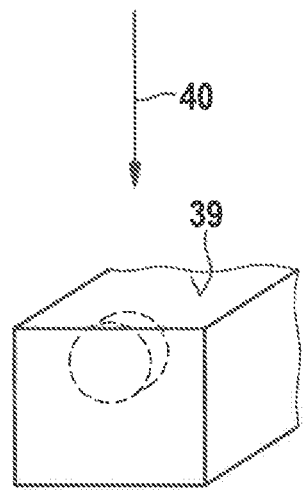
FIG. 3C                FIG. 3D

METHOD AND APPARATUS FOR CAPTURING VOLUME INFORMATION OF THREE-DIMENSIONAL SAMPLES

CROSS-REFERENCE TO RELATED APPLICATION

This application claims priority under 35 U.S.C. § 119 to German Application No. 10 2019 210 452.5, filed Jul. 16, 2019. The contents of this application are hereby incorporated by reference in its entirety.

FIELD

The disclosure relates to methods and apparatuses for preparing three-dimensional, microscopic samples. In the process, volume information of the sample is captured, i.e., information about the three-dimensional structure of the sample.

BACKGROUND

It is often desirable to examine and image three-dimensional structures within a microscopic sample. This is possible with the aid, for example, of tomographic processes, in which individual planes of a three-dimensional sample are imaged without overlap. It is then possible to create a 3D reconstruction of the three-dimensional structure of the sample with the aid of a sequence of such layer images. Using nano-tomography, sample details which are concealed in the interior of the sample block can be presented with a high resolution in this manner.

In general, in nano-tomography methods, very thin layers of a sample, which have a thickness of only a few nanometers, for example, are successively ablated, with an image of each layer being recorded. The images obtained are then combined to form a three-dimensional reconstruction of the sample structure.

In general, in FIB/SEM nano-tomography, which is advantageously carried out using an FIB-SEM combination device, the layers are ablated via a focused ion beam (FIB). The sample layers can be ablated with a focused ion beam are typically less than 10 nm thick. The individual exposed layers are usually imaged with the aid of a scanning electron microscope (SEM).

In general, in an SEM, a primary electron beam is generated via an electron source, the primary electron beam being steered and focused onto the sample to be examined by way of a beam guiding system, which typically includes an objective lens. The primary electron-beam can be steered over the sample in a grid-like fashion with the aid of a deflection device. The primary electrons incident on the sample can interact with the material of the sample, and so interaction products can be released. By way of example, these interaction products can be secondary electrons (SE) or backscattered electrons (BSE). The interaction products can be detected using suitable detectors and used for image generation. Depending on the type of detected interaction products, it is possible to generate image representations with different image contrasts.

An FIB-SEM combination device should be understood to mean a microscope system which, in addition to an SEM, also includes an ion beam column for generating a focused ion beam (FIB). An ion beam is generated using an ion source in the ion beam column, and the ion beam can be steered and focused onto the sample. Using the ion beam, it is possible to ablate material from the sample or deposit material on the sample surface in a targeted fashion. Secondly, the ion beam can also be used to release detectable interaction products from the sample such that an image of the sample can be generated. By way of example, the interaction products can be secondary electrons (SE), but also secondary ions or backscattered ions.

In principle, the target volume can be broadly exposed during the preparation of tomography samples in order to approach the target region of interest. This can be desirable because conventional FIB systems can often be used to expose a very limited depth of the sample on account of the low FIB ablation rates. In practice, the depth that is ablatable by a beam of charged particles is usually limited by the processing time. By way of example, in some cases, an FIB beam could take a plurality of days to ablate a sample layer with a thickness of approximately 50 µm.

Therefore, FIB-SEM tomography examinations are usually used for those target regions that lie close to the sample surface.

Deeper regions are usually initially exposed outside of the FIB-SEM device so that this is referred to as ex-situ method. By way of example, the target region of a sample can be exposed by mechanical thinning, cutting or polishing. Cutting samples with an ultramicrotome is known. This method can involve removing the sample from the sample chamber of the FIB-SEM system, to be processed externally and to be reintroduced into the FIB-SEM system following the ex-situ preparation.

The provision of an ultramicrotome in the interior of an electron microscope used for the examination is known (so-called in-situ microtomy).

Although in-situ microtomy can facilitate the mechanical ablation of relatively thick layers (e.g., with layer thicknesses between 20 nm and 200 nm), it can be limited in the z-direction because often an ultramicrotome cannot be used to ablate arbitrarily thin sample layers. It is possible that target volume is ablated inadvertently during cutting with the microtome, and hence of losing parts of the volume of interest. On account of the minimum cut thickness of the microtome dictated by technology, it is generally not possible to further increase the resolution in the z-direction.

Therefore, it can be desirable to ablate thick layers with a microtome in sample regions distant from the target volume but to ablate only respectively smaller layer thicknesses from sample regions in the vicinity of the target region. In other words, it may be desirable to switch between coarse processing (coarse ablation) and fine processing (fine ablation) depending on the distance between the sample region currently to be ablated and the target volume.

There are various known methods where sample material is removed by virtue of combining ultramicrotomy and ablation with a focused particle beam.

In general, this combination of the processes involves initially cutting the sample using a stand-alone ultramicrotome and then to be transferred into a microscope system, where the sample can subsequently be processed and/or imaged using a particle beam.

In these ex-situ methods, the target region is usually prepared with an accuracy specified by the employed process. By way of example, if the microtomy is implemented under visual control with a light microscope, the resolution of the latter is typically limiting. Moreover, the sample may be received and removed again in and respectively from the various processing systems.

Furthermore, there have been propositions to dispose an ultramicrotome in the sample chamber of an SEM in order to carry out so-called "serial block face imaging" (Denk &

Horstmann 2004). In this method, an image of the surface (block face) of a block-shaped sample is produced. Then, the currently imaged, uppermost sample layer is removed with the aid of the microtome so that the next surface layer is exposed, which is imaged in turn, and so on. In this way, a series of images of the sample showing adjacent sample structures is obtained.

Moreover, correlative processes have been described, in which microCT (microscopic X-ray computed tomography), light microscopy and transmission electron microscopy, for example, are combined with one another (Handschuh et al., 2013).

Documents of potential interest include: DE 10 2012 217 761 A1; Denk, W. & Horstmann, H. (2004): Serial Block-Face Scanning Electron Microscopy to Reconstruct Three-Dimensional Tissue Nanostructure, PloS Biology, volume 2, issue 11, pages 1900-1908; Handschuh et al. (2013): A correlative approach for combining microCT, light and transmission electron microscopy in a single 3D scenario, Frontiers in Zoology, 10, 44; and Ng et al. (2016): Genetically targeted 3D visualization of *Drosophila* neurons under Electron Microscopy and X-Ray Microscopy using mini-SOG, Scientific Reports 6: 38863.

SUMMARY

The present disclosure relates to a method for capturing volume information of a microscopic sample, and an apparatus for carrying out the method and a computer program product, with the aid of which an apparatus is prompted to carry out the method. Volume information is understood to mean information about spatial structures situated in the interior of the sample. By capturing section images of the sample, it is possible to create a data record on the basis of which it is possible to calculate a 3D model of the internal structures.

In an aspect, the disclosure provides a method for capturing volume information of a microscopic sample, carried out with the aid of a microscope system. The microscope system has a first particle beam column, by which a first beam of focused, charged particles can be generated, and an in-situ microtome. The method includes: providing a sample including a volume of interest; setting a cut surface lying within the sample; defining the set cut surface as processing surface; exposing the cut surface by virtue of ablating sample material by cutting with the in-situ microtome; and processing the sample with the first particle beam. The start point of the processing is disposed on the exposed processing surface.

In an aspect, the disclosure provides an apparatus for capturing volume information of a microscopic sample. The apparatus includes a first particle beam column for generating a first beam of focused charged particles, and a second particle beam column for generating a second beam of focused charged particles. The apparatus also includes an in-situ microtome, and a holding apparatus for receiving a sample. The apparatus is configured to carry out a method as disclosed herein.

In an aspect, the disclosure provides a computer program product including a sequence of control commands, by which an apparatus is prompted to carry out a method as disclosed herein.

In some embodiments, in order to carry out a method according to the disclosure, a sample to be examined is received in a sample chamber of a microscope system. In some embodiments, it can be particularly advantageous if the microscope system includes a first particle beam column for generating a focused electron beam and a second particle beam column for generating a focused ion beam. Moreover, the microscope system includes an in-situ microtome, i.e., a microtome integrated into the microscope system. In some embodiments, it can be particularly advantageous if the in-situ microtome is disposed in the interior of the sample chamber. The sample can be processed using the integrated microtome while the sample is in the sample chamber under vacuum conditions. Consequently, it is not mandatory to remove the sample from the sample chamber in order to process the sample with a microtome outside of the microscope system. Furthermore, the microscope system includes a displaceable sample stage for receiving a sample.

In some embodiments, it was found to be advantageous if the integrated microtome is embodied as an ultramicrotome. An ultramicrotome is understood to be a microtome that can produce semi-thin cuts (cut thickness from approximately 100 nm to more than 500 nm) and/or ultra-thin cuts (cut thickness from approximately 20 nm to 100 nm). Usually, the cut thickness and the cutting speed can be set in continuous fashion.

The disclosure is based, in part at least, on the realization that it is particularly advantageous to be able to switch between coarse processing and fine processing in a targeted manner when preparing a volume of interest (VOI) from a microscopic sample.

Coarse processing of the sample material, i.e., removing sample layers with a thickness of approximately 20 nm to 500 nm, is carried out using a microtome while fine processing, i.e., the ablation of sample layers with a thickness of less than approximately 10 nm, is brought about using a focused particle beam.

The focused particle beam can be an ion beam. Usually, material thicknesses of between 1 nm and 10 nm can be ablated using a focused ion beam, for example layers with a thickness of 5 nm or 3 nm. However, it is also conceivable for the processing particle beam to be an electron beam or for the material ablation to be carried out by gas-induced electron-beam etching or gas-supported ion-beam etching.

The goal of the coarse processing is, in general, to remove, as quickly and efficiently as possible, those volumes that should not be examined or should only be examined with a lower resolution such that a deeper, more detailed volume (VOI) becomes accessible. The latter can then be exposed with a higher accuracy via fine processing, with only small sample volumes being removed in targeted fashion.

Here, it is often desirable for the sample region up to which the microtome is used to ablate and where the fine processing with the particle beam starts be set. To this end, a cut surface within the sample is set and defined as processing surface. This cut surface is exposed by a microtome cut such that processing using the particle beam can start at the exposed cut surface.

Thus, at least one cut surface is generated and exposed in the sample by the process of cutting the sample using the microtome. Typically, the severed sample material is discarded. Then, fine processing with the aid of the particle beam is started at a sample location disposed on the exposed cut surface. A cut surface where the fine processing starts is denoted a processing surface below. Fine processing by the focused particle beam can be configured in many different ways, e.g., as material ablation in the surface and/or at a depth, as production of a cross section, as TEM lamella preparation, as FIB-SEM tomography or as any other processing type. In any case, the fine processing of the sample starts where a cut surface (processing surface) has previously been produced using the microtome.

"Setting" a surface within the sample is understood to mean determining the precise position of the surface. Then, a set cut surface can be defined as a processing surface, meaning that the subsequent processing with the particle beam starts on this cut surface. Setting and defining can be implemented during the method (on the fly) or in predetermined fashion. In order to set and define the processing surface on the fly, suitable parameters are captured and evaluated during the method. When setting in a predetermined fashion, the position of a processing surface is determined on the basis of already known parameters of the sample. By way of example, such parameters may be known from earlier examinations of the sample.

In any case, the position of the processing surface should be chosen in such a way that it offers good starting conditions for the subsequent fine processing. By way of example, fine processing can start where a microtome cut leads to the volume of interest and this has been determined visually.

It is also conceivable for markings to be present in or on the sample, the markings having been exposed by the microtome cut and thereby indicating that fine processing should now be started.

However, other parameters could also be captured during the cutting process, or following the cutting, in order to define the processing surface. Thus, the cutting force needed to be applied to divide the sample using the cutting apparatus of the microtome could be measured. It is also conceivable for the sample current to be measured or for interaction signals to be integrated over the surface. The position of the volume of interest can be deduced from changes in these parameters, and so it is possible to set a processing surface.

Secondly, where the processing surface is localized can already be set before the coarse processing. This is advantageous, in particular, if information about the sample and the position of the VOI is already known, as may be the case for regular, technical structures, for example.

Moreover, correlative data about the sample, obtained previously in a different microscope system and now transferred to the FIB-SEM system, can also be used to set the position and the spatial orientation of the processing surface. By way of example, the correlative data could have been obtained with the aid of EDX methods or using light or x-ray microscopy.

Further, the number of microtome cuts may be set in advance. It may be particularly advantageous in this case if the thicknesses of the sample layers severed in the process are likewise known and set.

It is also conceivable for the method to be carried out in time-optimized fashion. To this end, the cuts are made with the microtome in such a way that the VOI is exposed, and the fine processing can be started, in the shortest possible time.

The method according to the disclosure includes at least the following steps: providing a sample including a volume of interest (VOI); setting a cut surface lying within the sample; defining a cut surface as processing surface; exposing the cut surface by virtue of ablating sample material with the aid of an in-situ microtome; and processing the sample with a focused particle beam, wherein the start point of this fine processing is disposed on the exposed processing surface.

It is also conceivable for images of the sample to be generated during the method, the images being generated, for example, with the SEM functionality of the FIB-SEM combination device. Furthermore, it is conceivable for detectable interaction products to be released from the sample with the aid of a focused ion beam such that an image of the sample can be generated. By way of example, the interaction products can be secondary electrons (SE), but also secondary ions or backscattered ions.

It was found to be particularly advantageous for the sample to be held in displaceable and/or rotatable fashion such that the sample can be aligned in such a way that the focused particle beam is incident in substantially perpendicular fashion on the processing surface. Moreover, the in-situ microtome can be embodied in such a way that it includes a sample stage for holding the sample.

As a result of the targeted change between coarse and fine processing during the preparation of the sample, the less interesting sample volume can be removed as quickly and efficiently as possible in order to make lower-lying, particularly interesting volumes accessible to fine processing. The target region can be found and exposed with great accuracy without the sample having to be removed from the microscope system. Moreover, it is possible to process a plurality of volume regions within a sample in this manner.

As a result, the processing time can be optimized without there being the risk of sample regions of particular interest being inadvertently disturbed or even being entirely lost. Moreover, the method facilitates automation of the sample processing.

BRIEF DESCRIPTION OF THE FIGURES

Exemplary embodiments of the disclosure are explained below on the basis of figures.

FIGS. 3A-3D schematically show a principle of a method.

EXEMPLARY EMBODIMENTS

Figure 1:
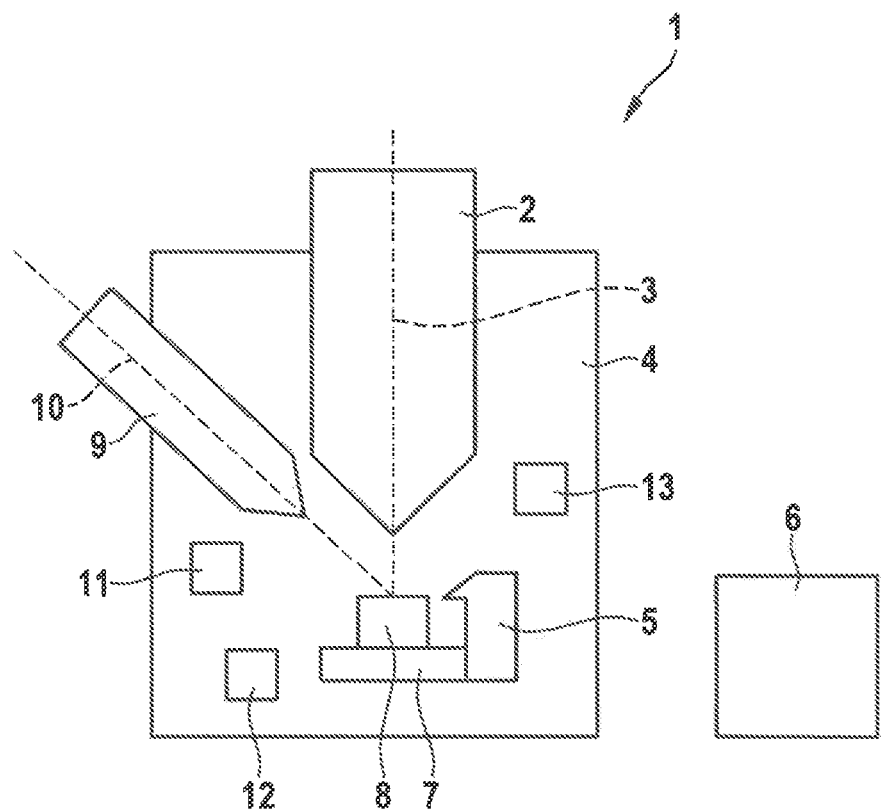
FIG. 1 shows a microscope system, which is configured to carry out a method according to the disclosure.

FIG. 1 illustrates a microscope system 1 that can be used to carry out the method according to the disclosure. The microscope system 1 includes an SEM column (also referred to as an electron beam column) 2, which has an optical axis 3, and an FIB column (also referred to as an ion beam column) 9, which has an optical axis 10.

The SEM column 2 is a particle beam column that can be used to generate a focused electron beam and direct the latter on a sample 8 to be examined. The FIB column 9 can be used to generate a beam of focused ions and likewise direct the latter on the sample 8. The sample 8 is held within a sample chamber 4 where vacuum conditions are generally prevalent during operation. Advantageously, the sample 8 is held by a movable holding apparatus 7, which allows the sample 8 to be moved in the three spatial directions x, y and z and to be rotated about two axes of rotation.

Moreover, the microscope system 1 includes an in-situ microtome 5, which is disposed in the sample chamber 4. Thus, the sample 8 can be processed with the aid of the in-situ microtome 5 while the sample 8 is held in the sample chamber 4 under vacuum conditions. The in-situ microtome 5 has a cutting apparatus, for example a diamond blade, which can be used to cut the sample 8 in order to remove material from the sample.

The cutting apparatus should be adjustable. As a result, it can be disposed in such a way that the cut produced in or on the sample 8 has a predetermined location and spatial orientation. Advantageously, the sample 8 is also disposed in movable fashion such that it can assume any spatial orientations relative to the cutting apparatus. By way of example, the in-situ microtome 5 can be embodied as a rotary or traversing microtome. Advantageously, the size of the microtome is matched to the ratios of the sample chamber 4 such that the in-situ microtome 5 can be integrated into the sample chamber 4. The in-situ microtome 5 has a miniaturized form in a particular embodiment. The in-situ microtome 5 can be embodied as an ultramicrotome.

It is advantageous if the sample 8 is held on a displaceable sample stage 7, which is situated in the sample chamber 4. By way of example, the sample stage 7 can be embodied as a five-axis sample stage.

In a particularly advantageous embodiment, the sample stage is included by the in-situ microtome. Thus, this means that the in-situ microtome is embodied in such a way that it has a movable holding apparatus for receiving the sample. This is advantageous in that the sample can both be cut by the in-situ microtome and be displaced using the integrated holding apparatus in such a way that the sample can be processed using the FIB beam and/or imaged by using SEM and/or FIB.

Moreover, the microscope system 1 includes one or more detectors 11 for detecting interaction products emitted by the sample 8 when a beam of charged particles is incident on the sample.

In a particular embodiment, the microscope system includes a sample current measurement device 12 for measuring the sample current. Sample current is understood to mean the electric current that is discharged from the sample when charged particles are incident on the sample. Changes in the measured sample current may be an indication of altered properties of the sample. By way of example, different material compositions may supply distinguishable measurable sample currents in the case of the same beam current (i.e., in the case of the same current of incident primary particles).

Further, the microscope system may have an apparatus 13 for measuring the cutting force.

Moreover, the microscope system 1 includes an evaluation and control unit 6, with the aid of which the movements of sample stage 7 and in-situ microtome 5 can be controlled.

Figure 2A:
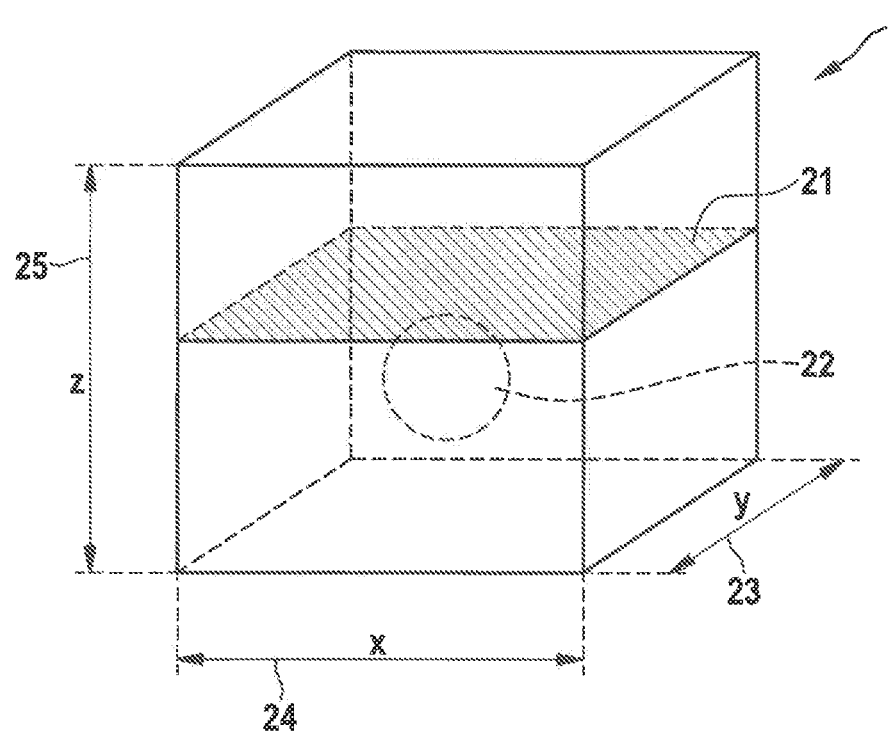
FIGS. 2A-2B show a three-dimensional sample in exemplary fashion, the sample being examined using a method according to the disclosure.
Figure 2B:
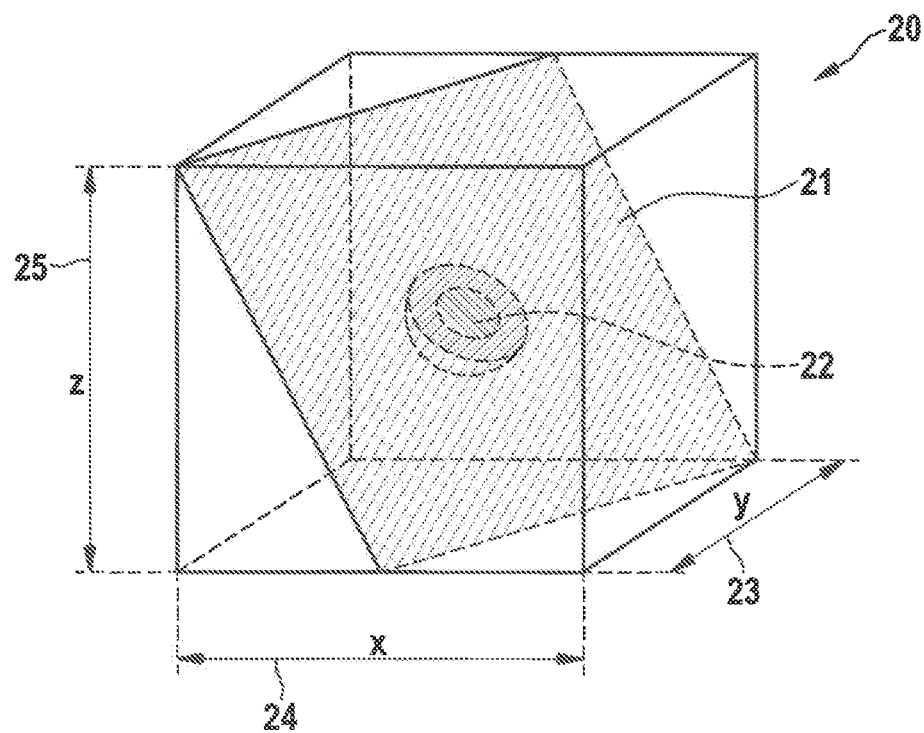

FIGS. 2A and 2B show a three-dimensional sample 20, for which volume information should be captured using the method according to the disclosure. A volume region 22, which is examined and referred to as volume of interest (VOI), is situated in the interior of the sample 20. For reasons of simplicity, the sample 20 is represented by a cuboid, which has an extent in the x-direction 24, y-direction 23 and z-direction 25. The shape of the sample 20 may also deviate from a cuboid and may adopt any other shape that has an extent in the three spatial directions 23, 24, 25.

An imaginary plane 21 intersects the sample volume. The plane 21 can intersect or touch the volume of interest 22. However, it is also conceivable for the plane 21 to be spaced apart from the volume of interest 22.

A plane 21 defines a cut surface, i.e., a two-dimensional extent, along which the sample 20 is cut using an in-situ microtome, which may be embodied as an ultramicrotome, during the further course of the method. The precise position of the plane 21—and consequently also the position of the cut surface—can be determined by various manifestations of the method, which will be explained in more detail in the descriptions relating to FIGS. 4 and 5.

The "position" of the cut surface is understood to mean the location and the spatial orientation of the cut surface. The term location refers to the localization of the cut surface in three-dimensional space. The location can be described by the indication of x-, y- and z-coordinates. The spatial orientation is understood to mean the alignment of the cut surface. The spatial orientation can be specified in relation to the optical axes of the microscope system or in relation to the spatial axes of the sample. Within this meaning, a "position" can also be specified for a processing surface, a plane, a sample, a volume of interest (VOI) or any other object.

This virtual plane 21 can be parallel to one or more spatial axes, as illustrated in FIG. 2A. However, the disclosure is not restricted to such an alignment. Rather, it is also conceivable for the plane 21 to adopt any other location and spatial orientation. Here, location and spatial orientation can be chosen on the basis of the form of the sample and the position of the volume of interest 22 within the sample. An alternative spatial orientation of the plane 21 to that shown in FIG. 2A is illustrated in exemplary fashion in FIG. 2B.

Since cutting with a microtome is only possible with limited accuracy and a thickness that cannot be undershot (minimum thickness), it may be particularly advantageous if the imaginary plane 21 is situated in the vicinity of the VOI 22 without however touching the VOI 22. This ensures that no region of the VOI 22 is inadvertently removed during cutting.

In any case, the generated cut surface, in which the preparation with the particle beam starts (i.e., which should be made the processing surface), should be chosen in such a way that it is an expedient starting region for the fine processing.

FIGS. 3A-3D schematically show the procedure of the method according to the disclosure.

All illustrated elements are disposed within a sample chamber, not illustrated, of a microscope system. The sample 30 to be examined is provided in the sample chamber.

As illustrated in FIG. 3A, the sample 30 has a VOI 33 in its interior. An imaginary (virtual) plane 32 is disposed in the vicinity of the VOI 33. The imaginary plane 32 divides the sample 30 in two parts: Sample part 31 and sample part 34, the latter including the VOI 33.

The sample 30 is cut with the aid of an in-situ microtome 36 (FIG. 3B). To this end, the in-situ microtome 36 includes a cutting apparatus 35, which separates the sample parts 31 and 34 from one another in the plane 32. It is particularly advantageous if the microtome is embodied as an ultramicrotome.

Usually, ultramicrotomes include a maximum cut thickness; i.e., it is not possible to sever arbitrarily thick cuts from a sample. As a rule, it is only possible to sever sample layers of up to approximately 500 nm. Therefore, it may be desirable to initially carry out a plurality of cuts in order to ablate less interesting sample layers situated further to the outside and to be ultimately able to expose the desired processing surface.

As shown in FIG. 3C, the sample 30 now has an exposed cut surface 38, the position of which was predetermined by setting the virtual plane 32. In order to further process the sample 30, a focused particle beam 37 is steered on to the exposed surface 38, which is referred to as processing surface 38 below. By way of example, the focused particle beam 37 can be a focused ion beam. More specifically, the particle beam 37 strikes that sample part 34 containing the VOI 33.

Fine processing is preferably implemented using a focused ion beam, as illustrated in FIG. 3C. However, it is also conceivable for the focused particle beam to be an electron beam or for the ablation to be implemented by gas-induced electron-beam etching or gas-supported ion-beam etching.

The sample 30 can be processed further in many different ways with the aid of the focused particle beam. By way of example, a cross section can be produced. It is also conceivable for a TEM lamella or any other micro-sample to be prepared, such as, e.g., needle-shaped, cylinder-shaped or conical micro-samples for tomography.

Moreover, it is possible to directly carry out FIB-SEM tomography. To this end, the sample material is ablated further layer by layer—starting in the processing surface—using a focused ion beam (FIB), with each layer being imaged without overlap with the aid of the SEM function of the microscope system. A three-dimensional reconstruction can be created from the layer images.

In any case, the fine processing of the sample 30 is started at a sample point localized in the processing surface 38, which has been determined by setting the virtual plane 32 in advance.

In an exemplary fashion, FIG. 3D shows that the sample has been ablated further in the region of the VOI 33 with the aid of the ion beam 37, as a result of which a second surface 39 has been exposed. In the shown example, the second surface 39 intersects the VOI 33, and so the region of interest can now be imaged with high resolution with the aid of the electron beam 40. To this end, interaction products that arise when the electron beam is incident on the sample are detected with the aid of a suitable detector (not illustrated) such that an image of the sample can be generated.

Figure 4:
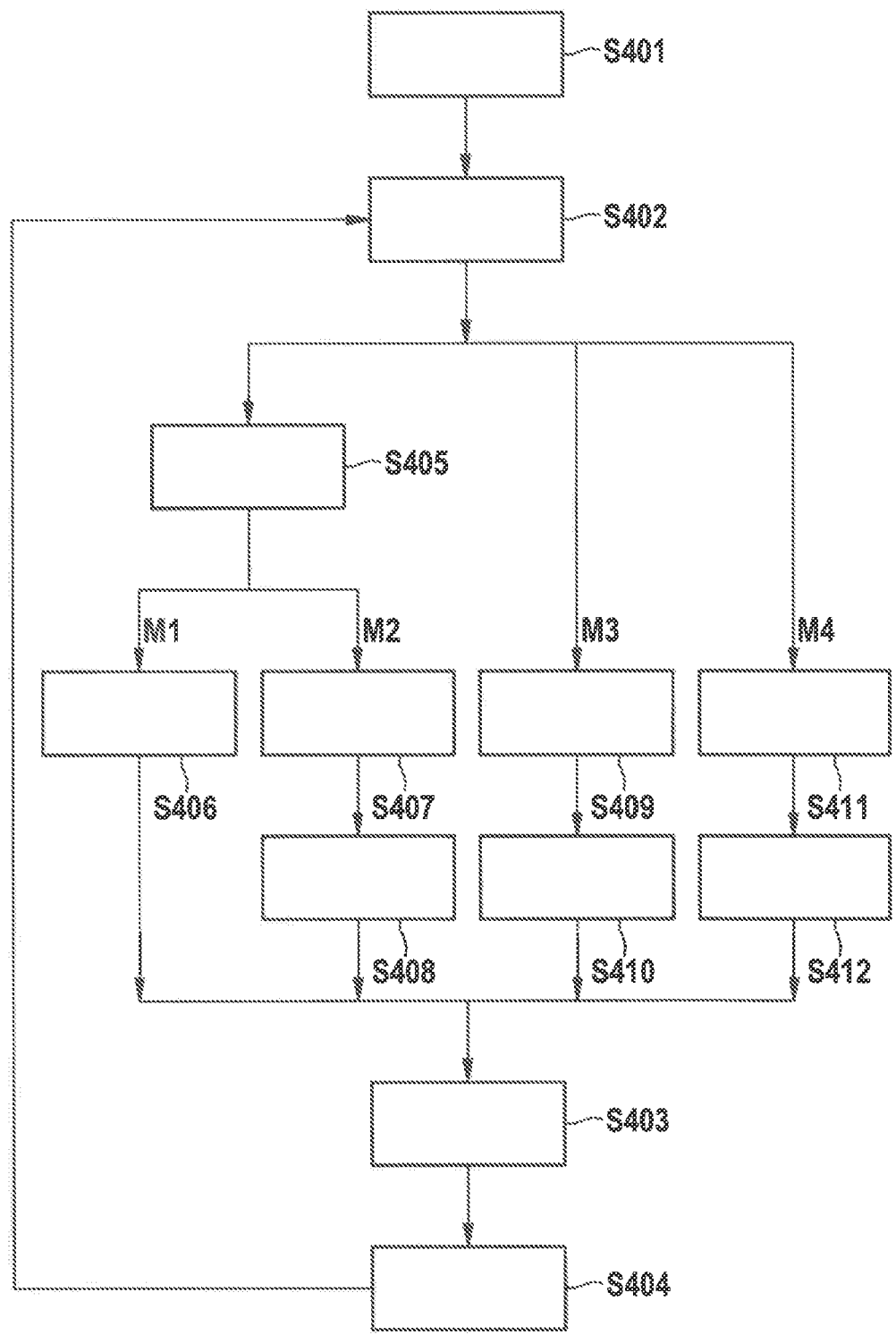
FIG. 4 schematically shows the progress of a method according to the disclosure, wherein the processing surface is set and defined during the method (i.e., on the fly).

FIG. 4 schematically shows the progress of an embodiment of the method according to the disclosure, in which a cut surface is set and defined as processing surface during the running method (i.e., on the fly).

A sample is provided in the sample chamber of the microscope system in step S401.

A cut surface is exposed by processing with the in-situ microtome in step S402. That is to say, therefore, that the sample is cut using the in-situ microtome. Step S402 can be repeated so that, therefore, a plurality of cut surfaces are successively exposed.

In step S403, one of the exposed cut surfaces is defined to be a processing surface. This means that, proceeding from this processing surface, the further fine processing is carried out by virtue of the processing with the focused particle beam starting on this surface. Different embodiments of the method M1, M2, M3, M4, which can also be combined with one another, can be used to define a cut surface as a processing surface. Setting and defining the processing surface can be implemented by the user or carried out in automated fashion.

In one embodiment (M1) of the method, at least one exposed cut surface is imaged such that the processing surface can be determined on the basis of a visual inspection. This can be implemented by virtue of interaction products such as, e.g., secondary electrons or backscattered electrons being captured using a suitable detector (step S405). An image is generated with the aid of the detected signals (step S406), on the basis of which image the exposed and imaged cut surface is defined as being intended to serve as a processing surface (step S403).

In a further special embodiment the sample contains at least one marker. By way of example, the marker can be attached externally to the sample, e.g., as a mechanically attached or laser-produced marker. It is particularly advantageous if the marker is visually identifiable.

However, it is also conceivable for the marker to be situated within the sample, for example in the form of a layer made of a different material. By way of example, a sample may contain a carbon layer. If an exposed cut surface contains a marker material (carbon in this example), this can be identified on the basis of detected interaction products. Then, the cut surface thus identified is set to be the processing surface.

In an alternative variant, a carbon layer is additionally deposited in the sample in order to use this as a marker. Furthermore, there is the option of a biological sample (e.g., affixed tissue embedded in artificial resin) having a layer containing heavy metals or nanoparticles that bring about element-specific contrast that can be captured by a detector. Moreover, it is possible to use markers that specifically bind to certain regions within the tissue.

In an alternative embodiment (M2), use is made of the option of signal integration. To this end, exposed cut surfaces are irradiated by charged particles in order to detect the arising interaction products (step S405). However, there is no need to generate an image in this embodiment. Rather, the detected signals are integrated over the surface (step S407). The intensity of the integrated signals from different surfaces is compared, and so it is possible to determine changes in the intensity of the detector signals (step S408).

If the user-defined threshold of the changes in intensity is exceeded, the cut surface where the determined change occurs is set to be the processing surface. By way of example, the detected signal can be integrated over the surface. If the signal yield—e.g., the secondary electron yield—changes in the process, the cut surface is set to be the processing surface.

It is also conceivable (M3) that the sample current discharged from the sample is measured for each exposed cut surface (S409). If changes in the sample current are registered in the process (S410), this can be used as a criterion for defining the cut surface as a processing surface. A user-defined threshold can be determined to this end.

In an alternative embodiment (M4), the cutting force of the in-situ microtome is measured when exposing each cut surface in order to define the processing surface on the basis of a determined change in the cutting force.

The cutting force is the force that needs to be applied to move the cutting apparatus through the sample material in order to sever a material layer and thus generate a cut surface. The force to be applied is determined by the type and composition of the sample material. By way of example, inclusions in the sample or an altered material composition may cause a change in the force to be applied.

The cutting force is measured in step S411. If a change in the cutting force exceeding a certain threshold is registered (step S412), the cut surface is set to be the intended processing surface. By way of example, the cutting force can be measured in piezoelectric fashion. To this end, the microscope system may include an apparatus for measuring the cutting force in piezoelectric fashion.

Thus, once the processing surface has been determined according to any one of the described methods (M1 to M4), fine processing of the sample using a focused particle beam can now start in step S404. As already described for FIGS. 3A-3D, it is possible to generate, e.g., a cross section or a TEM lamella or a different type of micro-sample or start an FIB-SEM tomography examination.

Figure 5:
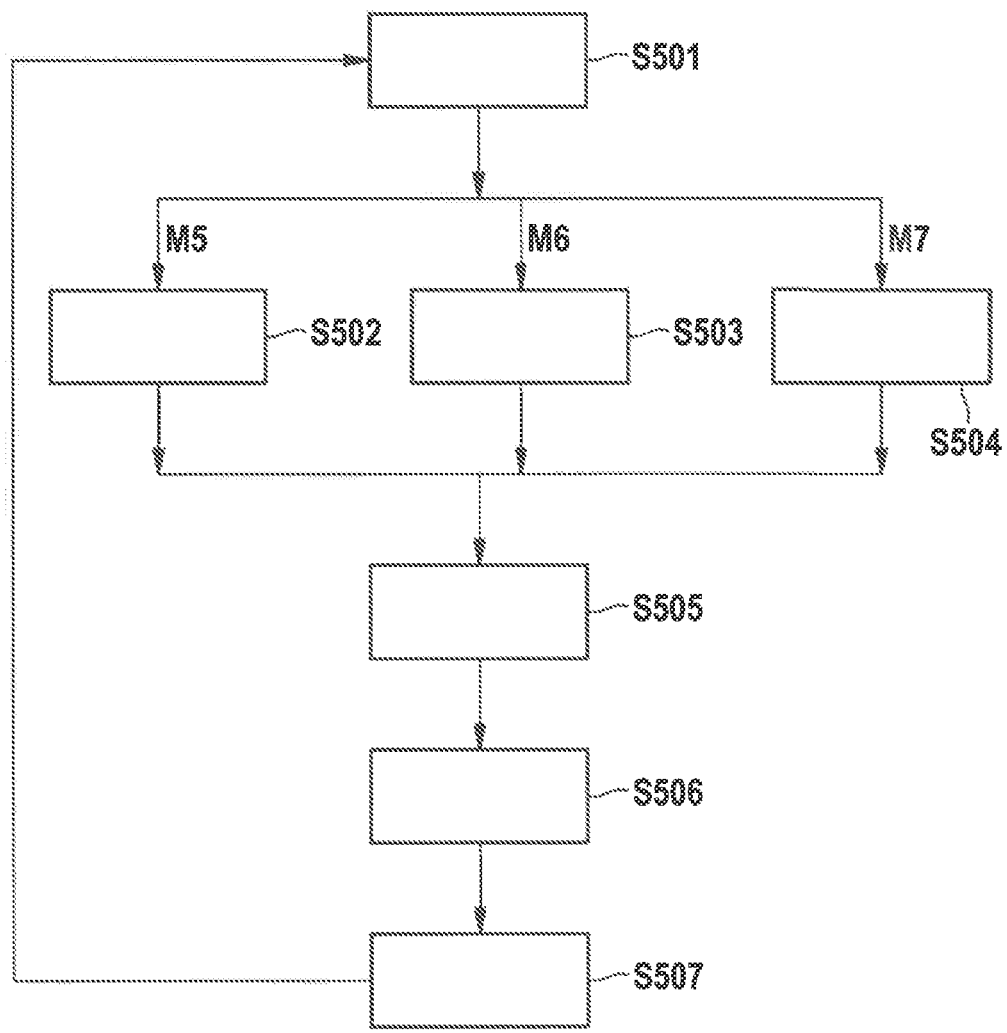
FIG. 5 schematically shows the progress of a method, in which the processing surface is set and defined in advance, i.e., in predetermined fashion.

FIG. 5 schematically shows the progress of an embodiment of the method according to the disclosure, where the processing surface is set in predefined fashion using known information about the sample.

A sample is provided in the sample chamber of the microscope system in step S501.

In order to set (S505) a cut surface that is intended to be defined as a processing surface, use can be made of various alternative embodiments of the method (M5, M6, M7), which are described below.

Once the processing surface has been defined, the processing surface is exposed in step S506 by cutting with the in-situ microtome.

Finally (step S507), the sample is processed using the focused particle beam. Here, processing starts at a sample point localized in the exposed processing surface.

In order to set a processing surface, the exact position of the processing surface is determined on the basis of a previously recorded, correlative data record (S502) in an advantageous embodiment (M5). To this end, correlative data of the sample are recorded and provided with the aid of a first microscope system. By way of example, the first microscope system can be an x-ray microscope, a light microscope or a microscope system with an EDX (energy dispersive x-ray) apparatus.

The data obtained with the aid of the first microscope system can be image data (2D), volume data (3D) or else measurement data. The data are stored in relation to a coordinate system of the first microscope system.

The sample and the associated, stored data are then transferred to a second microscope system, which should be used to carry out the method according to the disclosure. The second microscope system likewise includes a coordinate system, which is aligned in correspondence with the first coordinate system. Using a coordinate transformation, the data of the sample are converted into the second coordinate system such that the sample can also now be navigated in the second microscope system and sample points of interest can be retrieved.

This allows information about the position of the VOI to be transferred to the second microscope system. Knowing the position of the VOI in the sample allows the location and the spatial orientation of the processing surface to be defined; that is to say, the processing surface can be set with the aid of a set of correlative data.

It is known that sample holders specifically developed for this purpose may be helpful when registering the correlative data by virtue of facilitating the transfer of data from one coordinate system into another coordinate system.

In a further embodiment (M6), the position of the processing surface is set in such a way that capturing the volume information about the VOI can be carried out in the shortest possible processing time (S503). To this end, the position of the VOI within a sample block should be known in advance.

Microtomes usually only have a limited maximum cut thickness, and so it may be desirable to initially carry out a plurality of cuts in order to ablate (and discard) sample layer further out in order thus to approach the VOI situated in the interior of the sample. This may mean that an intended processing surface can only be exposed after a plurality of sample layers have been ablated. This may be very time-consuming in the case of an unfavorable choice of cuts.

Therefore, it is advantageous to set the position of the sample relative to the cutting apparatus of the microtome (S503) in such a way that the processing surface can be exposed as efficiently as possible and in a short processing time. Moreover, it is possible to set which steps and how many steps are carried out by the in-situ microtome.

Therefore, depending on the form of the sample and the position of the VOI within the sample, location and spatial orientation of the sample are chosen in relation to the cutting apparatus with the goal of optimizing the cuts. As a result, the processing surface can be exposed within the shortest possible time and/or with a favorable orientation. This goal should also be taken into account when choosing the respective layer thicknesses of the microtome. Advantageously, thicker sample layers are ablated first, followed by thinner ones.

By way of example, if the VOI is disposed at a large distance from a first external sample side but, on the other hand, has a small distance from a second external sample side, the sample should be aligned in such a way that the material ablation starts from the second external sample side. The position of the processing surface should be set accordingly between the second external sample side and the VOI.

In a further alternative embodiment (M7), the position of the processing surface is set by virtue of defining the number of cutting processes in advance (S504). Moreover, it is possible to determine the thickness of the cuts in advance, i.e., the thickness of the sample layers to be ablated. After working through a predetermined number of cutting processes, a sample layer that is available as a processing surface is exposed.

It is also possible for steps S505, S506 and S507 to be repeated such that a sequence of processing surfaces is set and this yields successive fine processing with the particle beam.

In principle, it is also conceivable for individual steps of the method, which was described on the basis of FIGS. 4 and 5, or for the entire method to be repeated, with the same or a different process (M1 to M7) being able to be chosen in each case for the purposes of setting and defining the processing surface(s).

Figure 6A:
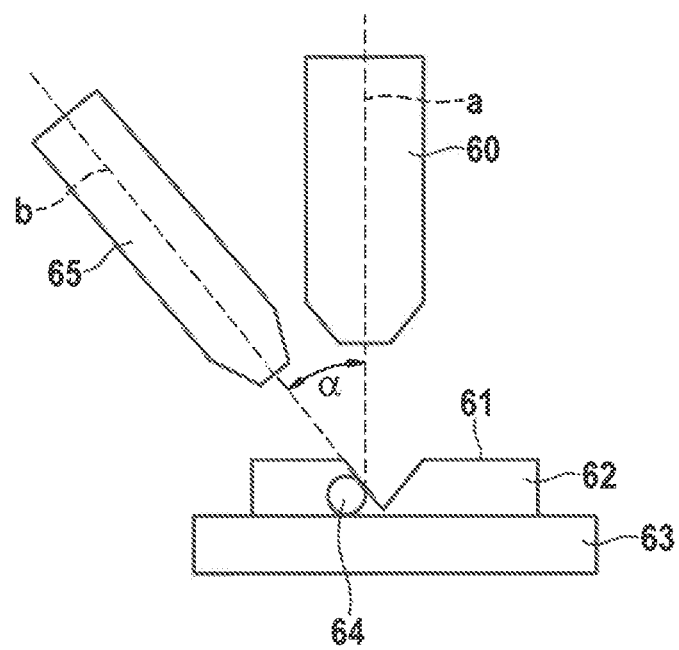
FIGS. 6A-6C show various configurations of a fine processing of an exposed processing surface using a focused particle beam.
Figure 6B:
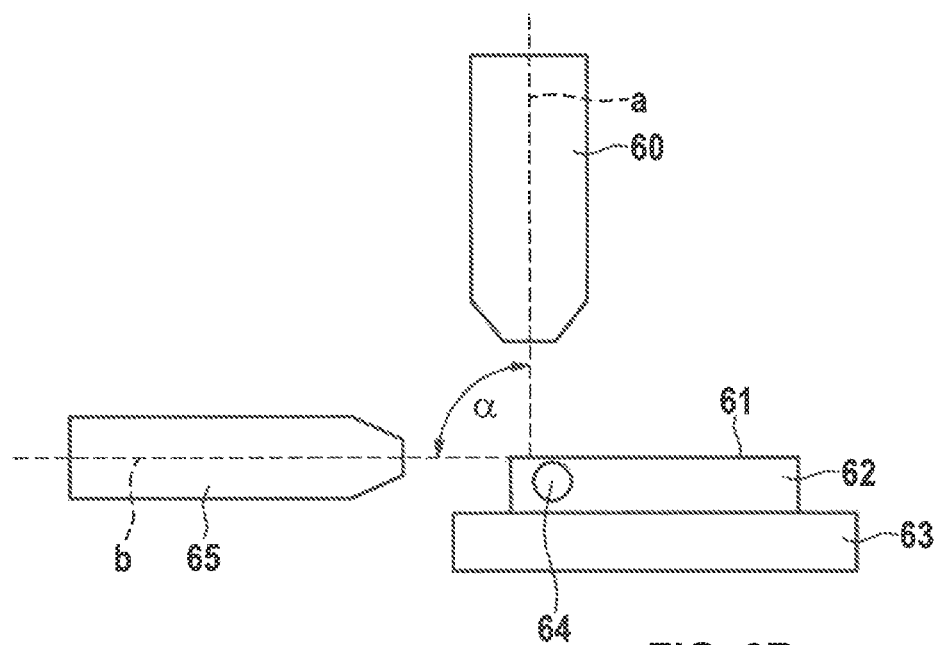
Figure 6C:
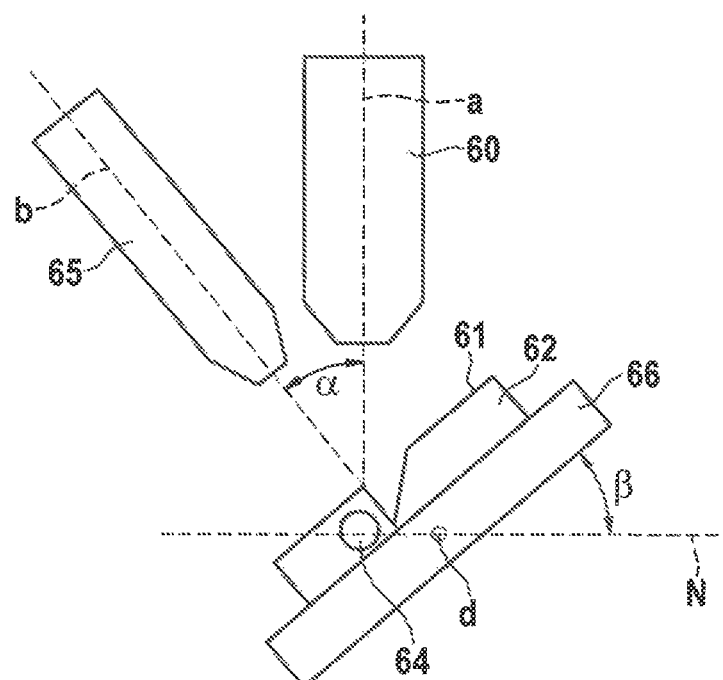

FIGS. 6A-6C show various embodiments of the fine processing (S404, S507) of the exposed processing surface using a focused particle beam.

The microscope system used to carry out the method includes a first particle beam column 60, which has an optical axis a, and a second particle beam column 65, which has an optical axis b. The optical axes a and b are disposed in such a way that they adopt an angle $\alpha$ relative to one another. The first particle beam column 60 can be embodied as an SEM column while the second particle beam column 65 can be embodied as an FIB column.

The sample 62 is held by a sample holder 63. A volume of interest (VOI) 64 is situated in the interior of the sample 62. The processing surface 61 has been exposed by preceding method steps.

In the embodiment shown in FIG. 6A, the two particle beam columns 60, 65 are disposed at an angle $\alpha$ of approximately 54°. The processing surface 61 (sample surface) can be irradiated by electrons from the SEM column (electron beam column) 60. The arising interaction products can be detected by a suitable detector (not illustrated) and can be used to generate an image of the sample. The electrons are incident in substantially perpendicular fashion on the processing surface 61.

The sample can be processed using the ion beam generated in the FIB column (ion beam column) 65. Here, the ions strike the processing surface 61 of the sample at an angle α. FIG. 6B shows an alternative embodiment in which the angle α is approximately 90°. That is to say, the two particle beam columns are disposed more or less perpendicular to one another. The electron beam strikes the processing surface in substantially perpendicular fashion while the ion beam has a grazing incidence on the sample. Expressed differently: the ion beam strikes the sample in parallel with the longitudinal extent of the exposed cut surface. This is advantageous in that very thin layer thicknesses can be ablated using the ion beam. Moreover, redeposition of the separated sample material only occurs to a small extent.

In a particularly advantageous embodiment (FIG. 6C), the sample 62 is rotatably disposed relative to the optical axes a and b. As a result, the sample surface to be processed (i.e., the processing surface) can be aligned at an angle β relative to the normal N of the optical axis a.

This can be brought about with the aid of a rotation element 66, the latter having an axis of rotation d about which the rotation element 66 is rotatable. Advantageously, the axis of rotation d extends perpendicular to the optical axis a. In the illustration of FIG. 6C, the axis of rotation d emerges in perpendicular fashion from the plane of the drawing.

The rotation element 66 can be embodied as a rotatable sample stage or as a rotatable sample holder. It is also conceivable for the in-situ microtome to have a rotatable embodiment as a whole and consequently for the in-situ microtome to be considered to be a rotation element 66. In any case, the sample is held indirectly or directly by the rotation element 66.

The sample is disposed in such a way that it is rotatable through an angle θ about an axis of rotation d that extends perpendicular to the optical axes a and b. Consequently, the sample can be rotated about the axis of rotation d while the method according to the disclosure is carried out such that the processing surface can assume various, selectable orientations relative to the incident particle beams.

It was found to be particularly advantageous if the ion beam is incident in substantially perpendicular fashion on the processing surface during the fine processing of the sample. This is the case when the angle β approximately or exactly adopts the absolute value of the angle α.

It is also conceivable for the angle β to be greater than the absolute value of the angle α such that the sample is overtilted (a so-called "overtilt"). This is advantageous in that perpendicular flanks can be generated.

Figure 7:
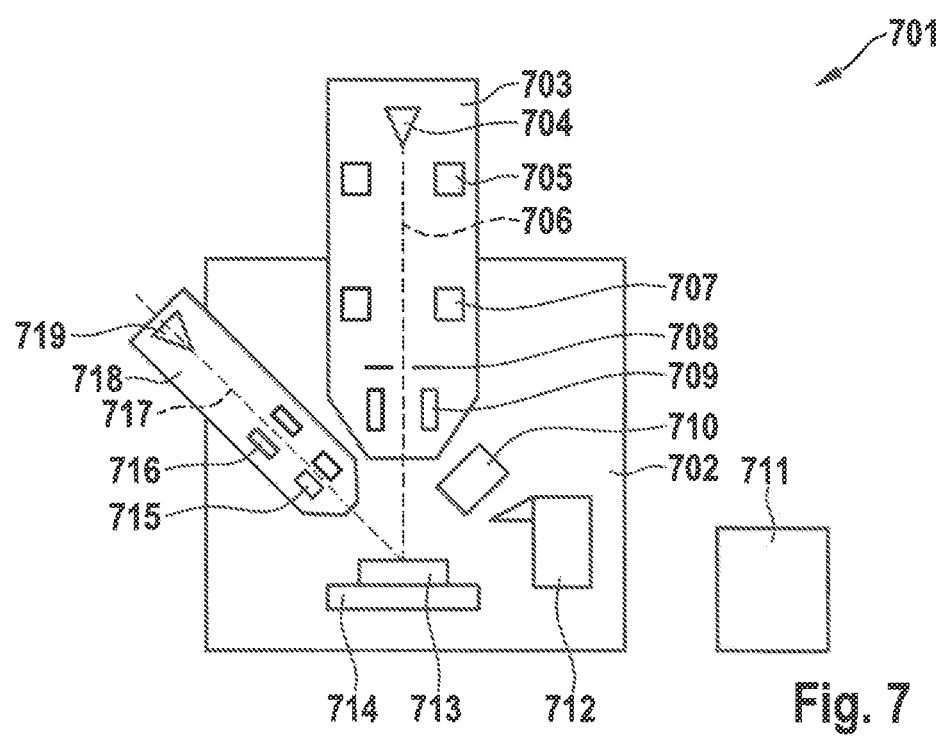
FIG. 7 schematically shows an FIB-SEM combination device, which can be used to carry out a method.

FIG. 7 schematically shows an FIB-SEM combination device 701 with an integrated, miniaturized microtome 712. The FIB-SEM combination device 701 includes a movable sample stage 714, which can receive the sample 713 to be examined. Sample stage 714 and microtome 712 are disposed in the sample chamber 702 of the FIB-SEM combination device 701. During operation, vacuum conditions usually prevail in the sample chamber 702. It is particularly advantageous if the microtome 712 is embodied as an ultramicrotome.

Advantageously, the sample stage 714 is connected to an evaluation and control unit 711, by which the sample stage 714 is at least displaceable in the x, y and z spatial directions.

Advantageously, the sample stage 714 is embodied as a five-axis sample stage. This means that the sample receptacle can be displaced in the x-, y- and z-direction—i.e., in three mutually perpendicular spatial directions—and can be rotated about a tilt axis and an axis of rotation.

Primary electrons can be produced in the electron source 704 of the electron beam column 703, the primary electrons being accelerated along the optical axis 706 of the electron beam column 703 and focused by the lens systems 705, 707, wherein the electron beam is trimmed by at least one aperture stop 708. Moreover, the electron beam column 703 includes a deflection system 709, by which the primary electron beam can be guided over the sample 713 in a grid-like fashion. The FIB-SEM combination device 701 furthermore includes at least one detector 710 for detecting interaction products.

Moreover, the FIB-SEM combination device 701 includes an ion beam column 718 with an ion source 719, a deflection system 716 and focusing lenses 715. The ions produced in the ion source 719 are accelerated along the optical axis 717 of the ion beam column 718 and focused such that the ions are incident on the sample section 713 in focus and can be used to ablate material from the sample section 713.

Moreover, the FIB-SEM combination device 701 includes at least one evaluation and control unit 711, by which the FIB-SEM combination device 701 and/or individual components thereof are controlled such that it is also possible to control the movements of the sample 713 and the cutting movements of the microtome 712.

The evaluation and control unit 711 can carry out a sequence of control commands included in a computer program product according to the disclosure. As a result, the FIB-SEM combination device 701 is prompted to perform an embodiment of the method according to the disclosure.

1 Microscope system
2 SEM column (electron beam column)
3 Optical axis of the SEM column
4 Sample chamber
5 In-situ microtome
6 Evaluation and control unit
7 Holding apparatus (sample stage)
8 Sample
9 FIB column (ion beam column)
10 Optical axis of the FIB column
11 Detector
12 Sample current measuring device
13 Apparatus for measuring the cutting force
20 Sample
21 Plane
22 Volume of interest (VOI)
23 Longitudinal extent in the y-direction
24 Longitudinal extent in the x-direction
25 Longitudinal extent in the z-direction
30 Sample
31 First sample part
32 Virtual plane
33 Volume of interest (VOI)
34 Second sample part
35 Cutting apparatus (blade)
36 In-situ microtome
37 Focused ion beam (FIB)
38 Processing surface
39 Second exposed surface
40 Electron beam S401 Providing sample
S402 Exposing a cut surface
S403 Setting a cut surface as processing surface
S404 Processing the sample
S405 Detecting interaction products
S406 Generating an image
S407 Integrating signals
S408 Capturing changes
S409 Measuring a sample current
S410 Capturing changes
S411 Measuring a cutting force
S412 Capturing changes
M1 Embodiment 1: visual inspection
M2 Embodiment 2: integrating signals
M3 Embodiment 3: sample current measurement
M4 Embodiment 4: cutting force measurement
S501 Providing sample
S502 Using correlative data
S503 Setting the position of the sample
S504 Setting the number of cuts
S505 Setting the cut surface
S506 Expose the cut surface
S507 Processing sample
M5 Embodiment 5: using correlative data
M6 Embodiment 6: time-optimized method
M7 Embodiment 7: setting the number of microtome cuts
60 SEM column
61 Processing surface
62 Sample
63 Holding device
64 Volume of interest (VOI)
65 FIB column
66 Rotation element
a Optical axis of the SEM column
b Optical axis of the FIB column
d Axis of rotation
N Normal of the optical axis a
701 FIB-SEM combination device
702 Sample chamber
703 Electron beam column
704 Electron source
705 First lens system
706 Optical axis of the electron beam column
707 Second lens system
708 Aperture stop
709 Deflection system
710 Detector
711 Evaluation and control unit
712 Integrated microtome
713 Sample
714 Sample stage
715 Focusing lens
716 Deflection system
717 Optical axis of the ion beam column
718 Ion beam column
719 Ion source

What is claimed is:

1. A method of using a microscope system, the method comprising:
defining a cut surface lying within a sample as a processing surface;
using a microtome in the microscope system to remove sample material to expose the cut surface; and
processing the sample with a first particle beam of focused, charged particles generated by a first particle beam column in the microscope system,
wherein a start point of the processing is on the exposed processing surface.

2. The method of claim 1, further comprising imaging the sample.

3. The method of claim 2, further comprising using a second particle beam in the microscope system to image the sample with a second beam of focused, charged particles generated by the second particle beam.

4. The method of claim 3, further comprising rotating the sample about an axis of rotation that extends perpendicular to an optical axis of the first particle beam column so that the first particle beam is substantially perpendicular to the processing surface.

5. The method of claim 1, wherein processing the sample with the first particle beam comprises at least one method selected from the group consisting of using FIB/SEM nano-tomography, generating a cross section, preparing a TEM lamella, and preparing a micro-sample.

6. The method of claim 1, further comprising:
after exposing the cut surface, imaging the cut surface; and
using the image of the cut surface as a basis to define the processing surface.

7. The method of claim 1, further comprising:
measuring a cutting force for the removal performed by the microtome to determine changes in the cutting force; and
based on the determined changes in the cutting force, defining the cut surface where a change in the cutting force is determined as the processing surface.

8. The method of claim 1, further comprising:
after exposing the cut surface, irradiating the cut surface with charged particles;
detecting interaction products of the interaction between material of the sample and the charged particles;
integrating detection signals for the detected interaction products over the surface of the sample;
determining changes in an intensity of the integrated detection signals; and
defining a relevant cut surface is defined as the processing surface when a change in the intensity of the integrated detection signals exceeds a threshold.

9. The method of claim 1, further comprising:
after exposing the cut surface, irradiating the cut surface with charged particles;
measuring a sample current;
registering changes in the sample current; and
defining a relevant cut surface as the processing surface when a change in the registered sample current exceeds a threshold.

10. The method of claim 1, further comprising defining the processing surface based on a number of cutting processes performed using the microtome.

11. The method of claim 10, further comprising setting a thickness for each cutting process performed using the microtome.

12. The method of claim 1, further comprising positioning the sample relative to a cutting apparatus of the microtome to expose a volume of interest of the sample in a relatively short period of time.

13. The method of claim 1, further comprising using a correlative data record to set the cut surface and to define the cut surface as the processing surface.

14. An apparatus, comprising:
one or more processing devices; and
one or more machine-readable hardware storage devices comprising instructions that are executable by the one or more processing devices to perform operations comprising the method of claim 1.

15. The apparatus of claim 14, further comprising a microscope system, comprising:
- a microtome; and
- a first particle beam column configured to generate a first beam of focused, charged particles.

16. The apparatus of claim 15, further comprising a second particle beam column configured to generate a second beam of focused, charged particles.

17. The apparatus of claim 16, wherein:
the first particle beam column has first optical axis;
the second particle beam column has a second optical axis;
the first and second optical axes define a first angle relative to each other; and
the microtome generates a cut surface in the sample; and
the sample is rotatable about an axis of rotation that extends perpendicular to the first optical axis so the processing surface is alignable at a second angle relative to a normal of the first optical axis so that the first particle beam is configured to be substantially perpendicular to the processing surface.

18. The apparatus of claim 17, wherein the axis of rotation is configured so that the second angle adopts an absolute value of the first angle.

19. The apparatus of claim 15, wherein the microtome comprises a holding apparatus configured to receive a sample.

20. One or more machine-readable hardware storage devices comprising instructions that are executable by one or more processing devices to perform operations comprising the method of claim 1.

* * * * *

UNITED STATES PATENT AND TRADEMARK OFFICE
CERTIFICATE OF CORRECTION

PATENT NO. : 11,215,536 B2
APPLICATION NO. : 16/922182
DATED : January 4, 2022
INVENTOR(S) : Marlene Thaler et al.

Page 1 of 1

It is certified that error appears in the above-identified patent and that said Letters Patent is hereby corrected as shown below:

On the Title Page

Column 2 (Abstract), Line 6, delete "cam" and insert -- can --;

Page 2, Column 2 (Other Publications), Line 10, delete "10, 44; and." and insert -- 10:44. --.

In the Specification

Column 4, Line 51, delete "starts" and insert -- starts to --;

Column 13, Line 43, delete "θ" and insert -- β --.

Signed and Sealed this
Twenty-ninth Day of March, 2022

Drew Hirshfeld
*Performing the Functions and Duties of the*
*Under Secretary of Commerce for Intellectual Property and*
*Director of the United States Patent and Trademark Office*